United States Patent
Lee et al.

(10) Patent No.: US 9,312,587 B2
(45) Date of Patent: Apr. 12, 2016

(54) COMMON MODE FILTER AND METHOD OF MANUFACTURING THE SAME

(71) Applicant: SAMSUNG ELECTRO-MECHANICS CO., LTD., Suwon (KR)

(72) Inventors: Hong-Ryul Lee, Suwon (KR);
Young-Do Kweon, Suwon (KR);
Sang-Moon Lee, Suwon (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 44 days.

(21) Appl. No.: 14/206,275

(22) Filed: Mar. 12, 2014

(65) Prior Publication Data

US 2015/0145617 A1 May 28, 2015

(30) Foreign Application Priority Data

Nov. 22, 2013 (KR) .................... 10-2013-0143109

(51) Int. Cl.
| | |
|---|---|
| *H03H 7/00* | (2006.01) |
| *H01P 1/20* | (2006.01) |
| *H01P 11/00* | (2006.01) |
| *H01F 41/04* | (2006.01) |
| *H03H 7/42* | (2006.01) |
| *H01P 1/203* | (2006.01) |
| *H01F 17/00* | (2006.01) |

(52) U.S. Cl.
CPC ............ *H01P 1/20* (2013.01); *H01F 41/046* (2013.01); *H01P 11/007* (2013.01); *H03H 7/427* (2013.01); *H01F 2017/0066* (2013.01); *H01F 2017/0073* (2013.01); *H01F 2017/0093* (2013.01); *H01P 1/20345* (2013.01)

(58) Field of Classification Search
CPC ..... H01P 1/20; H01P 11/007; H01P 1/20345; H01F 41/046; H01F 2017/0066; H01F 2017/0072; H01F 2017/0093; H03H 7/427
USPC .......................................... 333/185
See application file for complete search history.

(56) References Cited

U.S. PATENT DOCUMENTS

| | | | | |
|---|---|---|---|---|
| 3,517,271 | A * | 6/1970 | Goodman et al. | 361/792 |
| 7,002,446 | B2 * | 2/2006 | Ito et al. | 336/200 |
| 7,023,299 | B2 * | 4/2006 | Shoji | 333/185 |
| 8,471,668 | B2 * | 6/2013 | Hsieh et al. | 336/200 |

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

A common mode filter a manufacturing method thereof are disclosed. The common mode filter in accordance with an embodiment of the present invention includes: a magnetic substrate; a receiving groove formed on the magnetic substrate; a dielectric layer formed in the receiving groove and having a coil pattern included therein; and a magnetic layer formed on upper surfaces of the dielectric layer and the magnetic substrate.

13 Claims, 4 Drawing Sheets

COMMON MODE FILTER AND METHOD OF MANUFACTURING THE SAME

CROSS-REFERENCE TO RELATED APPLICATIONS

This application claims the benefit of Korean Patent Application No. 10-2013-0143109, filed with the Korean Intellectual Property Office on Nov. 22, 2013, the disclosure of which is incorporated herein by reference in its entirety.

BACKGROUND

1. Technical Field

The present invention relates to a common mode filter and a method of manufacturing the common mode filter.

2. Background Art

High-speed digital interfaces, such as USB, require a part that addresses noise. One of such parts that removes common mode noise selectively is a common mode filter.

Common mode noise can occur when impedance fails to be parallel in the wiring system. The common mode noise can occur more often for higher frequency. Since the common mode noise can be also transferred to, for example, the surface of the earth and bounced back with a big loop, the common mode noise causes various kinds of noise troubles in far-away electronic devices.

The common mode filter can allow a differential mode signal to bypass while selectively removing the common mode noise. In the common mode filter, magnetic flux is canceled out by the differential mode signal, causing no inductance to occur and allowing the differential mode signal to bypass. On the other hand, magnetic flux is augmented by the common mode noise, increasing the inductance and allowing the noise to be removed.

The related art of the present invention is disclosed in Korea Patent Publication No. 2011-0129844 (COMMON MODE NOISE FILTER; laid open on Dec. 6, 2011).

SUMMARY

The present invention provides a common mode filter and a manufacturing method thereof, in which a receiving groove is formed in a magnetic substrate and a dielectric layer is formed in the receiving groove.

An aspect of the present invention features a common mode filter, which includes: a magnetic substrate; a receiving groove formed on the magnetic substrate; a dielectric layer formed in the receiving groove and having a coil pattern included therein; and a magnetic layer formed on upper surfaces of the dielectric layer and the magnetic substrate.

The magnetic layer can be in direct contact with the magnetic substrate.

The magnetic substrate and the magnetic layer can include a same magnetic component.

The magnetic component can include ferrite.

The receiving groove can be placed at an inner side of the magnetic substrate.

A thickness of the dielectric layer can be smaller than a depth of the receiving groove, and the magnetic layer can cover an inside wall of the receiving groove.

The common mode filter can further include an external electrode formed on the dielectric layer so as to be connected with the coil pattern and having one surface thereof exposed.

Another aspect of the present invention features a method of manufacturing a common mode filter, which includes: forming a receiving groove on a magnetic substrate; forming a dielectric layer in the receiving groove, the dielectric layer having a coil pattern included therein; and forming a magnetic layer on upper surfaces of the dielectric layer and the magnetic substrate.

The forming of the receiving groove on the magnetic substrate can include: forming a pattern of the receiving groove on the magnetic substrate; and removing portions of the magnetic substrate according to the pattern.

The magnetic layer can be in direct contact with the magnetic substrate.

The magnetic substrate and the magnetic layer can include a same magnetic component.

The magnetic component can include ferrite.

In the step of forming the receiving groove on the magnetic substrate, the receiving groove can be formed in such a way that the receiving groove is placed at an inner side of the magnetic substrate.

In the step of forming the dielectric layer in the receiving groove, the dielectric layer can be formed in such a way that a thickness thereof is smaller than a depth of the receiving groove.

The method can further include, after the forming of the dielectric layer in the receiving groove, forming an external electrode on the dielectric layer in such a way that one surface of the external electrode is exposed, the external electrode being connected with the coil pattern.

DETAILED DESCRIPTION

Figure 1:
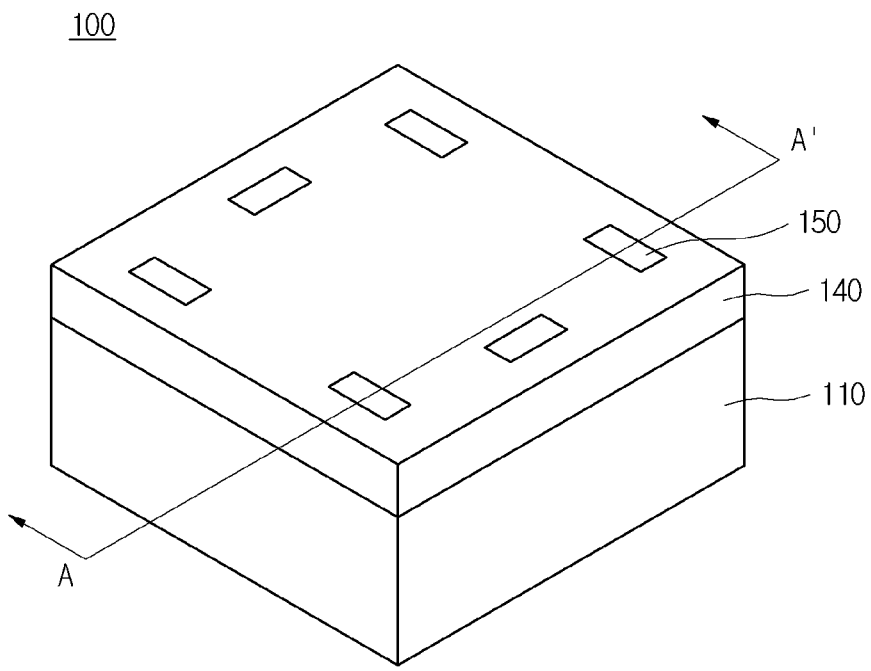
FIG. 1 is a perspective view of a common mode filter in accordance with an embodiment of the present invention.

Hereinafter, certain embodiments of a common mode filter and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 2:
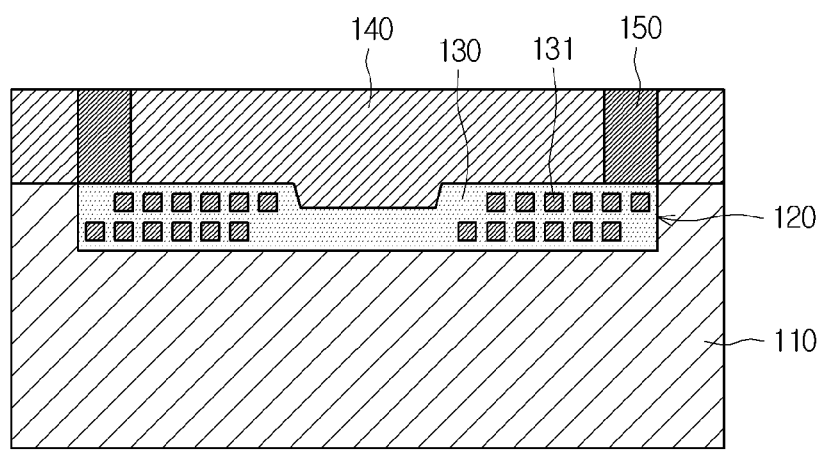
FIG. 2 is a cross-sectional view along the A-A' line of FIG. 1.
Figure 3:
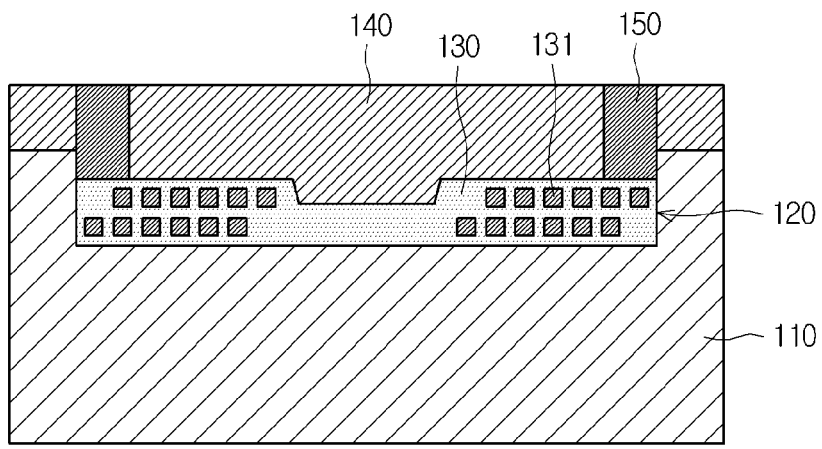
FIG. 3 is a common mode filter in accordance with another embodiment of the present invention.

FIG. 1 is a perspective view of a common mode filter in accordance with an embodiment of the present invention, and FIG. 2 is a cross-sectional view along the A-A' line of FIG. 1. FIG. 3 is a common mode filter in accordance with another embodiment of the present invention.

Referring to FIG. 1 and FIG. 2, a common mode filter 100 in accordance with an embodiment of the present invention can include magnetic substrate 110, receiving groove 120, dielectric layer 130, magnetic layer 140 and external electrode 150.

The magnetic substrate 110 is a board that is magnetic and is placed at a lowermost location of the common mode filter 100. The magnetic substrate 110 can include at least one of metal, polymer and ceramic, which are magnetic materials. The receiving groove 120 is a groove formed in the magnetic substrate 110.

The receiving groove 120 can be formed at an inner side of the magnetic substrate 110. In the case where the receiving groove 120 is formed at an inner side of the magnetic substrate 110, the receiving groove 120 can be formed in the middle of the magnetic substrate 110. In the case where the receiving groove 120 is formed in the middle of the magnetic substrate 110, an area where the magnetic substrate 110 and the magnetic layer 140 are coupled with each other can form a symmetry about a center of the receiving groove 120, allowing a stable coupling between the magnetic substrate 110 and the magnetic layer 140.

The receiving groove 120 can be formed by ion milling. In such a case, an ion beam can be irradiated to the magnetic substrate 110 in a plasma state. The receiving groove 120 can be formed by sand blasting. In such a case, sand and high-pressure air can be sprayed by a nozzle on a surface of the magnetic substrate 110.

The dielectric layer 130 is a layer that includes a coil pattern 131 and insulates the coil pattern 131 and the magnetic substrate 110 from each other. The coil pattern 131 is a device that functions as an inductor and can be made of a conductor.

Coils in the coil pattern 131 can be formed in pairs. Magnetic coherence occurs in between the pair of coils of the coil pattern 131, and common mode noise can be removed by this magnetic coherence. The dielectric layer 130 can be formed in the receiving groove 120.

The dielectric layer 130 can be formed in three layers. The first layer can be formed on a surface of the receiving groove 120. The second and third layers can be formed successively on the first layer, and can each include a conductor that constitutes the coil pattern 131.

As shown in FIG. 2, the height of the dielectric layer 130 can be the same as the depth of the receiving groove 120.

Preferably used as a material for the dielectric layer 130 can be polymer resin, for example, epoxy resin or polyimide resin, which has a good electrical insulation property and is highly workable.

The magnetic layer 140 is a layer that is magnetic and can be formed on an upper surface of the dielectric layer 130 and an upper surface of the magnetic substrate 110. The magnetic layer 140 can form a closed-magnetic circuit together with the magnetic substrate 110.

The magnetic layer 140 can be formed to be in direct contact with the magnetic substrate 110. Specifically, the magnetic layer 140 can be coupled to the upper surface of the magnetic substrate 110 excluding the receiving groove 120. In such a case, since there is a strong coherence between the magnetic layer 140 and the magnetic substrate 110, interlayer adhesion of the common mode filter 100 can be improved.

In the case where the receiving groove 120 is placed at an inner side of the magnetic substrate 110, the magnetic layer 140 can be joined with a boundary of the magnetic substrate 110.

The magnetic layer 140 can include magnetic powder and resin material. The magnetic powder allows the magnetic layer 140 to be magnetic, and the resin material allows the magnetic layer 140 to have fluidity.

The magnetic substrate 110 and the magnetic layer 140 can include a same magnetic component. Coupling of the magnetic substrate 110 and the magnetic layer 140 having the same magnetic component is a coupling of a same kind and thus can have an enhanced coherence. In such a case, the magnetic powder contained in the magnetic layer 140 can be a pulverized material of the magnetic substrate 110.

The magnetic component contained in the magnetic substrate 110 and the magnetic layer 140 can include ferrite, which refers to magnetic ceramic that includes iron oxide.

The external electrode 150 is formed on the dielectric layer 130 so as to be connected with the coil pattern 131. By being connected with an external circuit, the external electrode 150 can function as a terminal that flows a signal to the coil pattern 131. One surface of the external electrode 150 can be exposed so as to be connected with the external circuit. As shown in FIG. 1, the external electrode 150 can be provided in plurality.

Referring to FIG. 3, the common mode filter 100 in accordance with another embodiment of the present invention can include magnetic substrate 110, receiving groove 120, dielectric layer 130, magnetic layer 140 and external electrode 150. In the present embodiment, the height of the dielectric layer 130 can be smaller than the height of the receiving groove 120. In such a case, the magnetic layer 140 can cover up to an inside wall of the receiving groove 120. Accordingly, an area where the magnetic layer 140 and the magnetic substrate 110 are joined with each other can be expanded, and thus coherence between the magnetic layer 140 and the magnetic substrate 110 can be improved.

As described above, the common mode filter according to embodiments of the present invention has a receiving groove formed in a magnetic substrate, and a dielectric layer in the receiving groove, and thus can improve interlayer adhesion of the common mode filter, owing to a strong coherence between the magnetic layer and the magnetic substrate.

If the interlayer adhesion of the common mode filter were weak, moisture might be penetrated into an interface, easily causing cracks. However, if the interlayer adhesion is enhanced by the formed receiving grooved, the moisture resisting property and the durability of the common mode filter can be improved.

Hitherto, the common mode filter in accordance with some embodiments of the present invention has been described. Hereinafter, a method of manufacturing a common mode filter in accordance with an embodiment of the present invention will be described.

Figure 4:
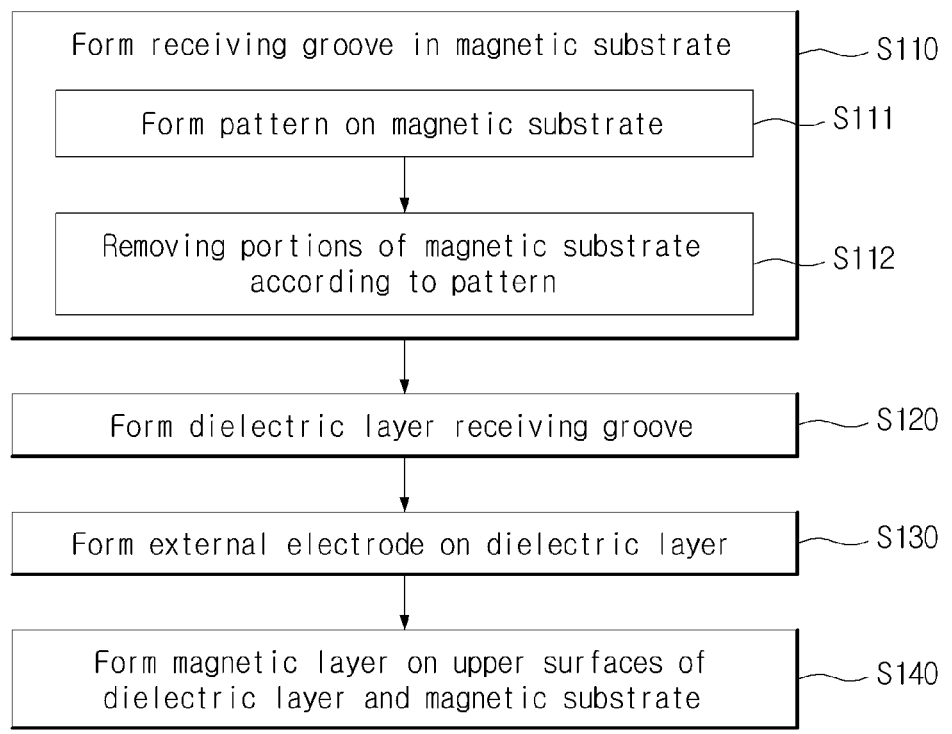
FIG. 4 is flow diagram showing a method of manufacturing a common mode filter in accordance with an embodiment of the present invention.

FIG. 4 is flow diagram showing a method of manufacturing a common mode filter in accordance with an embodiment of the present invention, and FIG. 5 to FIG. 9 show the flow of the method of manufacturing the common mode filter in accordance with an embodiment of the present invention.

Referring to FIG. 4, the method of manufacturing the common mode filter 100 in accordance with an embodiment of the present invention can include: forming a receiving groove 120 in a magnetic substrate 110 (S110); forming a dielectric layer 130 in the receiving groove 120 (S120); forming an external electrode 150 on the dielectric layer 130 (S130); and forming a magnetic layer 140 on upper surfaces of the dielectric layer 130 and the magnetic substrate 110 (S140). The step of forming the receiving groove 120 in the magnetic substrate 110 (S110) can include forming a pattern on the magnetic substrate 110 (S111) and removing portions of the magnetic substrate 110 according to the pattern (S112).

Figure 5:
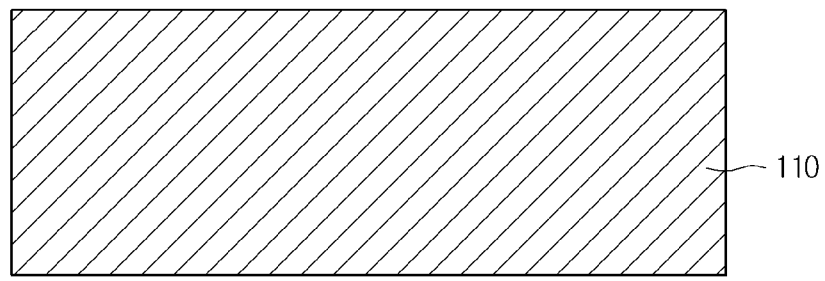
FIG. 5 to FIG. 9 show the flow of the method of manufacturing the common mode filter in accordance with an embodiment of the present invention.
Figure 6:
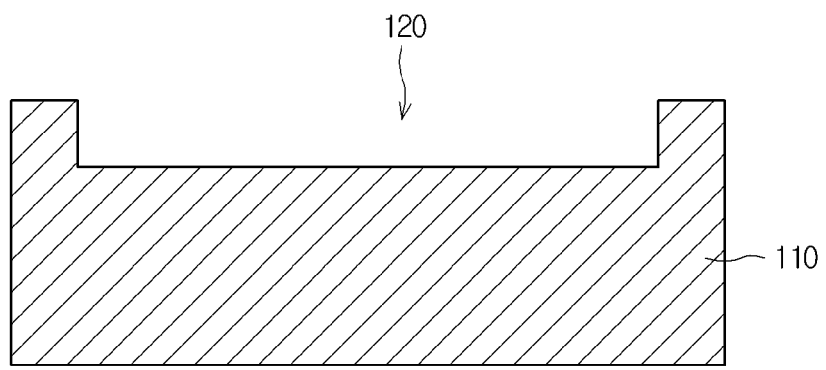

Referring to FIGS. 5 and 6, in the step of forming the receiving groove 120 in the magnetic substrate 110 (S110), a groove is formed in an upper portion of the magnetic substrate 110. The magnetic substrate 110 can be formed in plurality from a wafer. Moreover, the plurality of magnetic substrates 110 can each have the receiving groove 120.

The receiving groove 120 can have a depth of about 5 um and a width of about 300 um. The receiving groove 120 can be formed by ion milling or sand blasting.

The receiving groove 120 can be placed at an inner side of the magnetic substrate 110, and can be placed in the middle of the magnetic substrate 110. In such a case, the magnetic layer 140 can cover an upper surface of a boundary of the magnetic substrate 110.

In the step of forming a pattern on the magnetic substrate 110 (S111), a pattern corresponding to the receiving groove 120 is formed on the magnetic substrate 110. In the step of removing portions of the magnetic substrate 110 according to the pattern (S112), upper portions of the magnetic substrate 110 is removed by ion milling or sand blasting according to the pattern.

In the case where the magnetic substrate 110 is formed in plurality from a wafer, a plurality of patterns can be formed on the wafer, and a plurality of receiving grooves 120 can be formed simultaneously through the removing step of the magnetic substrate 110 (S112).

In the case where the receiving groove 120 is formed by forming the pattern, the receiving groove 120 can be formed easily and precisely.

Figure 7:
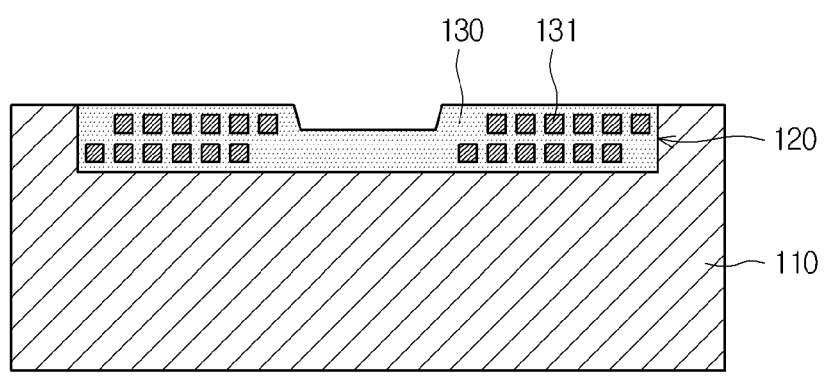

Referring to FIG. 7, in the step of forming the dielectric layer 130 in the receiving groove 120 (S120), the dielectric layer 130 containing a coil pattern 131 is formed inside the receiving groove 120. The coil pattern 131 has been described earlier and thus will not be described redundantly herein. The dielectric layer 130 can be constituted with three layers, one of which can be formed at a bottom of the receiving groove 120, and the other two layers, which contain a conductor of each respective coil pattern 131, can be successively formed over the one layer.

The dielectric layer 130 can be formed in such a way that a thickness thereof is the same as the depth of the receiving groove 120. In such a case, a surface of the dielectric layer 130 can be ground, after forming the dielectric layer 130 to be taller than the receiving groove 120, so that the thickness of the dielectric layer 130 is the same as the depth of the receiving groove 120.

The dielectric layer 130 can be formed in such a way that the thickness thereof is smaller than the depth of the receiving groove 120. In such a case, an area in which the magnetic layer 140 and the magnetic substrate 110 join with each other can be increased, making it possible to enhance interlayer adhesion of the common mode filter 100.

Figure 8:
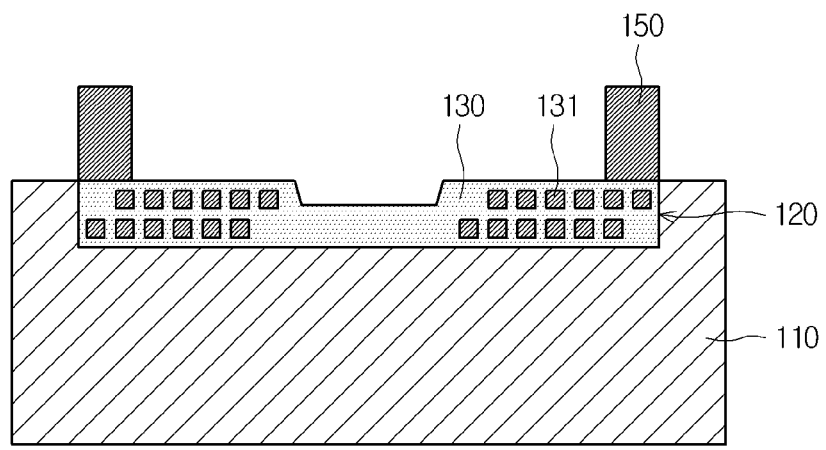

Referring to FIG. 8, in the step of forming the external electrode 150 on the dielectric layer 130 (S130), the external electrode 150 being connected with the coil pattern 131 is formed on the dielectric layer 130. In such a case, one surface of the external electrode 150 can be exposed in such a way that the external electrode 150 can be connected with an external circuit. The external electrode 150 can be formed in plurality.

Figure 9:
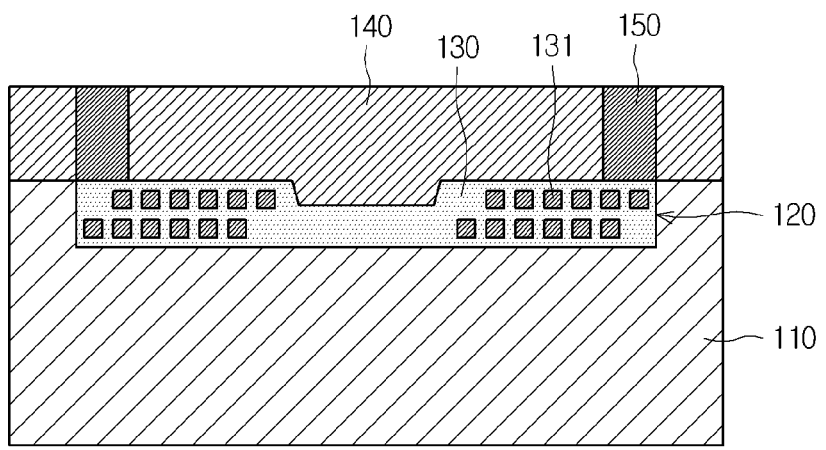

Referring to FIG. 9, in the step of forming the magnetic layer on the upper surfaces of the dielectric layer 130 and the magnetic substrate 110 (S140), the magnetic layer 140 is formed on the dielectric layer 130 in such a way that the magnetic layer 140 covers the upper surface of the magnetic substrate 110. The magnetic layer 140 can contain magnetic powder and resin material.

The magnetic layer 140 can be in direct contact with the magnetic substrate 110. Accordingly, since coherence is strong between the magnetic layer 140 and the magnetic substrate 110, it becomes possible to provide a strongly-cohered common mode filter 100.

The magnetic powder can be a same material as that of the magnetic substrate 110. In other words, the magnetic layer 140 and the magnetic substrate 110 can contain a same magnetic component. In such a case, the coherence between the magnetic layer 140 and the magnetic substrate 110 can be enhanced. The magnetic component can include ferrite.

As described above, through the method of manufacturing a common mode filter in accordance with an embodiment of the present invention, the dielectric layer is surrounded by the magnetic layer and the magnetic substrate because the dielectric layer is formed in the receiving groove, and the interlayer adhesion of the common mode filter becomes enhanced. When the interlayer adhesion is enhanced, the moisture resisting property and the durability of the common mode filter can be improved.

Although certain embodiments of the present invention have been described, it shall be appreciated that there can be a very large number of permutations and modification of the present invention by those who are ordinarily skilled in the art to which the present invention pertains without departing from the technical ideas and scope of the present invention, which shall be defined by the claims appended below.

It shall be also appreciated that many other embodiments than the embodiments described above are included in the claims of the present invention.

What is claimed is:

1. A common mode filter, comprising:
    a magnetic substrate;
    a receiving groove formed on the magnetic substrate;
    a dielectric layer formed in the receiving groove and having a coil pattern included therein; and
    a magnetic layer formed on upper surfaces of the dielectric layer and the magnetic substrate,
    wherein a thickness of the dielectric layer is smaller than a depth of the receiving groove, and
    wherein the magnetic layer covers an inside wall of the receiving groove.

2. The common mode filter of claim 1, wherein the magnetic layer is in direct contact with the magnetic substrate.

3. The common mode filter of claim 2, wherein the magnetic substrate and the magnetic layer comprise a same magnetic component.

4. The common mode filter of claim 3, wherein the magnetic component comprises ferrite.

5. The common mode filter of claim 1, wherein the receiving groove is placed at an inner side of the magnetic substrate.

6. The common mode filter of claim 1, further comprising an external electrode formed on the dielectric layer so as to be connected with the coil pattern and having one surface thereof exposed.

7. A method of manufacturing a common mode filter, comprising:
    forming a receiving groove on a magnetic substrate;
    forming a dielectric layer in the receiving groove, the dielectric layer having a coil pattern included therein; and
    forming a magnetic layer on upper surfaces of the dielectric layer and the magnetic substrate,
    wherein, in the step of forming the dielectric layer in the receiving groove, the dielectric layer is formed in such a way that a thickness thereof is smaller than a depth of the receiving groove.

8. The method of claim 7, wherein the forming of the receiving groove on the magnetic substrate comprises:

forming a pattern of the receiving groove on the magnetic substrate; and removing portions of the magnetic substrate according to the pattern.

9. The method of claim 7, wherein the magnetic layer is in direct contact with the magnetic substrate.

10. The method of claim 7, wherein the magnetic substrate and the magnetic layer comprise a same magnetic component.

11. The method of claim 10, wherein the magnetic component comprises ferrite.

12. The method of claim 7, wherein, in the step of forming the receiving groove on the magnetic substrate, the receiving groove is formed in such a way that the receiving groove is placed at an inner side of the magnetic substrate.

13. The method of claim 7, further comprising, after the forming of the dielectric layer in the receiving groove, forming an external electrode on the dielectric layer in such a way that one surface of the external electrode is exposed, the external electrode being connected with the coil pattern.

* * * * *